(12) United States Patent
Jeong et al.

(10) Patent No.: US 8,779,561 B2
(45) Date of Patent: Jul. 15, 2014

(54) LED BACKLIGHT UNIT WITHOUT PRINTED CIRCUIT BOARD AND METHOD OF MANUFACTURING THE SAME

(75) Inventors: Gi Ho Jeong, Busan (KR); Si Young Yang, Anyang-si (KR); Jae Wook Kwon, Seoul (KR); Jeong Hoon Park, Gyunggi-do (KR); Hyun Ju Yi, Seoul (KR); Choon Keun Lee, Gyunggi-do (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 455 days.

(21) Appl. No.: 12/779,695

(22) Filed: May 13, 2010

(65) Prior Publication Data

US 2010/0227423 A1 Sep. 9, 2010

Related U.S. Application Data

(62) Division of application No. 11/723,235, filed on Mar. 19, 2007, now abandoned.

(30) Foreign Application Priority Data

Mar. 21, 2006 (KR) .................... 10-2006-0025803

(51) Int. Cl.
*H01L 23/58* (2006.01)
(52) U.S. Cl.
USPC ............. 257/642; 257/99; 257/643; 257/758; 257/759; 257/E33.05; 257/E23.006; 257/E23.007; 257/E23.119; 257/E23.062; 257/E23.063; 257/E21.024; 257/E21.585; 257/760; 438/106; 438/622; 438/624; 438/631; 438/637; 29/848; 29/856; 174/258; 174/262; 174/265; 174/266; 205/125; 977/887; 977/888
(58) Field of Classification Search
USPC ........ 257/79, 88, 99, E33.056, 758, 750, 752, 257/760, 775, E23.006, E23.062, E23.063, 257/E21.585, 642, 643, E21.024, E23.007, 257/E23.119, 520, 528, 621, 622, 632, 700, 257/701, 759, 784, 459; 438/106, 622, 624, 438/631, 637, 640, 641, 700, 701, 713, 438/780–782; 29/848, 856; 174/258, 262, 174/265, 266; 977/887, 888; 205/125
See application file for complete search history.

(56) References Cited

U.S. PATENT DOCUMENTS

| 2005/0116299 A1* | 6/2005 | Koning et al. ................. 257/374 |
| 2006/0103024 A1* | 5/2006 | Salmon ......................... 257/758 |

FOREIGN PATENT DOCUMENTS

| JP | 2001-168398 | 6/2001 |
| JP | 2002-246652 A | 8/2002 |

(Continued)

OTHER PUBLICATIONS

Japanese Office Action issued in Japanese Patent Application No. 2007-072980, dated Jun. 1, 2010.

(Continued)

*Primary Examiner* — Meiya Li
(74) *Attorney, Agent, or Firm* — McDermott Will & Emery LLP

(57) ABSTRACT

Disclosed herein is a Light Emitting Diode (LED) backlight unit without a Printed Circuit board (PCB). The LED backlight unit includes a chassis, insulating resin layer, and one or more light source modules. The insulating resin layer is formed on the chassis. The circuit patterns are formed on the insulating resin layer. The light source modules are mounted on the insulating resin layer and are electrically connected to the circuit patterns. The insulating resin layer has a thickness of 200 μm or less, and is formed by laminating solid film insulating resin on the chassis or by applying liquid insulating resin to the chassis using a molding method employing spin coating or blade coating. Furthermore, the circuit patterns are formed by filling the engraved circuit patterns of the insulating resin layer with metal material.

5 Claims, 4 Drawing Sheets

(56) References Cited

FOREIGN PATENT DOCUMENTS

| JP | 2005-086075 | | 3/2005 |
|----|----|----|----|
| JP | 2005311314 A | * | 11/2005 |
| JP | 2006-011239 A | | 1/2006 |
| WO | WO 2004/071141 A2 | | 8/2004 |

OTHER PUBLICATIONS

United States Office Action issued in U.S. Appl. No. 11/723,235, dated Jul. 21, 2010.

Japanese Office Action with English translation issued in application No. 2007-072980 issued Apr. 3, 2012.

Japanese Office Action, w/ English translation thereof, issued in Japanese Patent Application No. JP 2007-072980 dated Jun. 14, 2011.

Chinese Office Action issued in CN 2007100872077 dated on May 9, 2008.

Ma et al "Thermal Analysis of High-power Light-emitting Diode Packages" Semiconductor Optoel Electronics pp. 16-19 vol. 27, No. 1 China Academic Journal Electronic Publishing House Feb. 2006.

* cited by examiner

PRIOR ART

LED BACKLIGHT UNIT WITHOUT PRINTED CIRCUIT BOARD AND METHOD OF MANUFACTURING THE SAME

CROSS REFERENCE TO RELATED APPLICATION

This application is a Divisional of U.S. application Ser. No. 11/723,235, filed on Mar. 19, 2007 now abandoned, claiming priority of Korean Patent Application No. 10-2006-0025803, filed on Mar. 21, 2006, the entire contents of each of which are hereby incorporated by reference.

BACKGROUND OF THE INVENTION

1. Field of the Invention

The present invention relates generally to a backlight unit installed in a Liquid Crystal Display (LCD) device and, more particularly, to a Light Emitting Diode (LED) backlight unit without a Printed Circuit board (PCB), in which light source modules, that is, LED packages, are directly mounted on a chassis.

2. Description of the Related Art

A backlight unit is a device that is installed in an LCD using the principle in which liquid crystals change their molecular arrangement according to applied voltage, and provides light and illuminates a screen from behind. Although backlight units to which one or more cold-cathode tubes are applied were mainly used, backlight units to which LEDs are applied currently attracts attention due to their advantages with respect to life span, brightness, color reproducibility, etc.

Unlike cold-cathode tubes, LEDs require substrates when they are used as light sources. Since such LEDs emit large quantities of heat while radiating light, metal core substrates (metal core printed circuit boards), having an excellent heat dissipation characteristic, have been used.

Although metal core substrates have an excellent heat dissipation characteristic, they are very expensive. Accordingly, the high cost of the metal core substrates is one of the principal factors that decrease the cost competitiveness of the backlight units formed of the metal core substrates. As a result, there is a trend toward the use of relatively inexpensive epoxy resin insulating substrates. An example of a conventional backlight unit in which LEDs are mounted on such an insulating substrate is illustrated in FIG. 4.

As illustrated in FIG. 4, a backlight unit 200 includes an insulating substrate 210, a plurality of LED packages 230, and a chassis 250.

Circuit patterns 211 and 212 are formed on the insulating substrate 210 by coating an epoxy resin FR4-core with a copper foil and etching the copper foil.

Each of the LED packages 230 is mounted such that an LED chip 231 is directly connected to one LED electrode 232 and is wire-bonded to the other LED electrode 233.

The LED chip 231 and the LED electrodes 232 and 233 are placed within a plastic mold casing 234, and the casing 234 is covered with an epoxy resin lens 235.

The LED package 230 is mounted on the insulating substrate 210, and is electrically connected to positive and negative electrodes, that is, to the circuit patterns 211 and 212.

The chassis 250 is made of material having excellent thermal conductivity, such as metal, and is placed beneath the insulating substrate 210, and a heating pad 270 is placed therebetween so as to provide electrical insulation and decrease contact thermal resistance.

In the conventional backlight unit 200 having the above construction, when the total thermal resistance is calculated, with the assumption that the thickness $t_{substrate}$ of the substrate 210 is 0.8 mm, the thermal conductivity $K_{substrate}$ of the substrate 210 is 0.35 W/m °C., the thickness $t_{heating\ pad}$ of the heating pad 270 is 0.2 mm, the thermal conductivity $K_{heating\ pad}$ of the heating pad is 1.00 W/m °C., and the area A of the substrate 210 or the heating pad 270 is 36 mm², $$R_{total} = R_{substrate} + R_{heating\ pad}$$
$$= (t_{substrate}/K_{substrate} + t_{heating\ pad}/K_{heating\ pad})A$$
$$= (0.8*10^{-3}/0.35 + 0.2*10^{-3}/1.00)/(36*10^{-6})$$
$$= 69.4°\ C./W$$

As explained above, the total thermal resistance is very high. When the thickness of the heating pad 270 is 0.5 mm, a total thermal resistance of 77.88° C./W results.

As a result, the insulating substrate of the conventional backlight unit having the above-described construction exhibits very poor thermal conductivity, therefore it is difficult to effectively eliminate heat generated by the LED chips, with the result that the temperature of the LED chips still increases. Accordingly, the amount of light emitted by the LED chips decreases, variation in wavelength occurs, and the reliability of the LED chips decreases, thus resulting in a reduced lifespan.

Furthermore, it is required to use a substrate to provide the circuit patterns connected to each LED chip. This increases the price of the backlight unit as well as the total thickness thereof.

Furthermore, the heating pad is made of a high polymer material having appearance characteristics similar to those of a thin rubber plate. This not only increases the price of the backlight unit and but also requires close attention to be paid to an assembly process.

SUMMARY OF THE INVENTION

Accordingly, the present invention has been made keeping in mind the above problems occurring in the prior art, and an object of the present invention is to provide a backlight unit, in which light source modules, that is, LED packages, are directly mounted on a chassis without the use of a PCB, thus reducing the thermal resistance and thickness thereof and, at the same time, decreasing the price thereof.

In order to accomplish the above object, the present invention provides a LED backlight unit without a PCB, including a chassis; an insulating resin layer formed on the chassis; circuit patterns formed on the insulating resin layer; and one or more light source modules mounted on the insulating resin layer and electrically connected to the circuit patterns.

According to an preferred embodiment of the present invention, the insulating resin layer has a thickness of 200 μm or less.

Furthermore, the insulating resin layer is formed by laminating solid film insulating resin on the chassis or by applying liquid insulating resin to the chassis using a molding method employing spin coating or blade coating.

Furthermore, the circuit patterns are formed by filling the engraved circuit patterns of the insulating resin layer with metal material. In this case, the engraved circuit patterns are formed by pressing the insulation resin layer using a stamp having embossed circuit patterns.

Furthermore, the light source modules are LED packages.

In addition, the present invention provides a method of manufacturing an LED backlight unit without a PCB, including the steps of forming an insulating resin layer on a chassis; forming engraved circuit patterns by engraving circuit patterns on the insulating resin layer; filling the engraved circuit patterns with metal material or plating the engraved circuit patterns with metal material; forming circuit patterns by removing metal material that does not fill the engraved circuit patterns; and mounting one or more light source modules on the insulating resin layer and electrically connecting corresponding light source modules with the circuit patterns.

According to a preferred embodiment of the present invention, the insulating resin layer has a thickness of 200 μm or less at the step of forming the insulating resin layer on the chassis.

Furthermore, the step of forming the insulating resin layer on the chassis is performed by laminating insulating resin on the chassis in solid film form or applying insulating resin to the chassis in liquid form. In this case, the insulating resin is applied to the chassis in liquid form using a molding method employing spin coating or blade coating.

Furthermore, the light source modules are LED packages.

BRIEF DESCRIPTION OF THE DRAWINGS

The above and other objects, features and advantages of the present invention will be more clearly understood from the following detailed description, taken in conjunction with the accompanying drawings, in which.

DESCRIPTION OF THE PREFERRED EMBODIMENTS

An LED backlight unit without a PCB and a method of manufacturing the same according to a preferred embodiment of the present invention are described in detail with reference to the accompanying drawings below.

Figure 1:
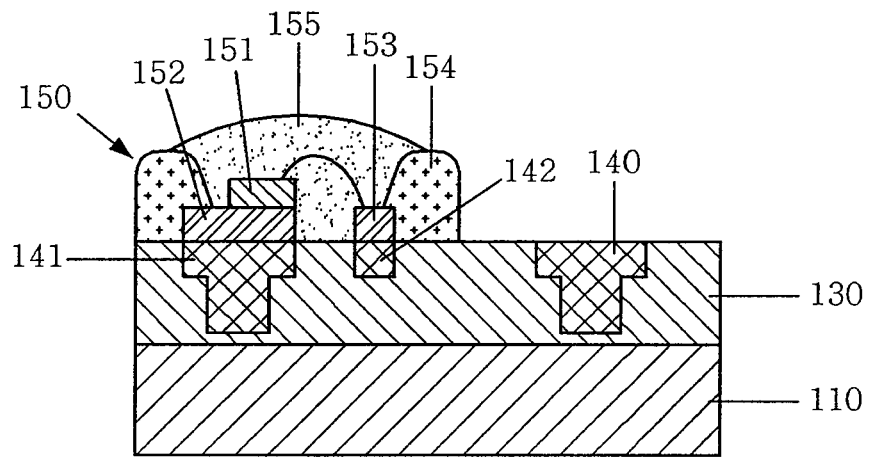
FIG. 1 is a schematic sectional view of an LED backlight unit without a PCB according to a preferred embodiment of the present invention.

As shown in FIG. 1, the backlight unit 100 of the present embodiment includes a chassis 110. An insulating resin layer 130 is formed on the chassis 110, and a plurality of LED packages 150 is mounted on the insulating resin layer 130.

The chassis 110 is an element that is used as a casing for the backlight unit 100, and is made of metal material, such as aluminum or copper, which has very excellent thermal conductivity. In particular, it is preferred that the chassis be made of aluminum material so as to reduce the weight thereof.

The insulating resin layer 130 is made of a high polymer material having appearance characteristics similar to a thin rubber plate, that is, a material similar or identical to a conventional heating pad. For this purpose, solid film-type insulating resin, having adhesiveness, or liquid insulating resin may be applied to the top surface of the chassis 110.

In this case, the solid film-type insulating resin is applied to the chassis 110 using a lamination method, and the liquid insulating resin is applied to the chassis 110 using a molding method employing spin coating or blade coating.

Furthermore, metal material, such as copper, is applied to the insulating resin 130, or the plated circuit pattern 140 is formed thereon. The circuit pattern 140 is formed by filling engraved patterns with metal material. Unlike a conventional technology, which uses a PCB to form the circuit pattern 140, the present invention directly forms the circuit pattern 140 on the chassis 110 as described above, thus reducing the total thickness of the backlight unit and, at the same time, greatly reducing the thermal resistance.

Although not shown, the LED packages 150 include a plurality of sets of LED packages for emitting red light, green right, and blue light. The plurality of sets of LED packages are mounted on the chassis 110 in accordance with a design. Since the LED packages have the same elements but emits respective light beams having different colors, only a single LED package 150 is shown in FIG. 1, for ease of description, and the description is made based on this.

Each of the LED packages 150 includes an LED chip 151, LED electrodes 152 and 153, a plastic molding casing 154, and a lens 155.

The LED chip 151 is a means for emitting red, green or blue light, is directly mounted on one LED electrode 152, and is electrically connected with another LED electrode 153 through wire bonding.

Furthermore, the LED electrode 152 is mounted on the positive one of the circuit patterns 141 and 142 formed on the chassis 110, and the LED electrode 153 is mounted on the negative one of the circuit patterns 141 and 142.

Furthermore, the LED chip 151 and the LED electrodes 152 and 153 are protected from the environment by the plastic molding casing 154, and the casing 154 is covered with the epoxy resin transparent lens 155.

Figure 2:
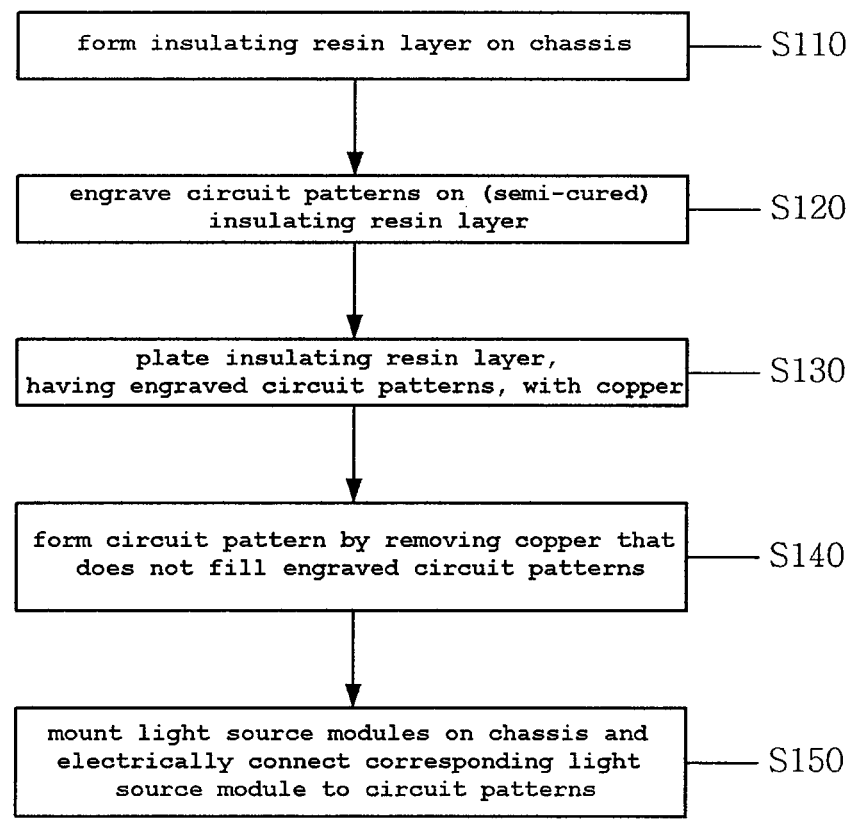
FIG. 2 is a flowchart illustrating a method of manufacturing the backlight unit of FIG. 1.

The backlight unit 100 of FIG. 1 is manufactured through the steps of the flowchart of FIG. 2, and the respective steps are schematically illustrated in FIGS. 3A to 3F to promote an understanding of the present invention.

Figure 3A:
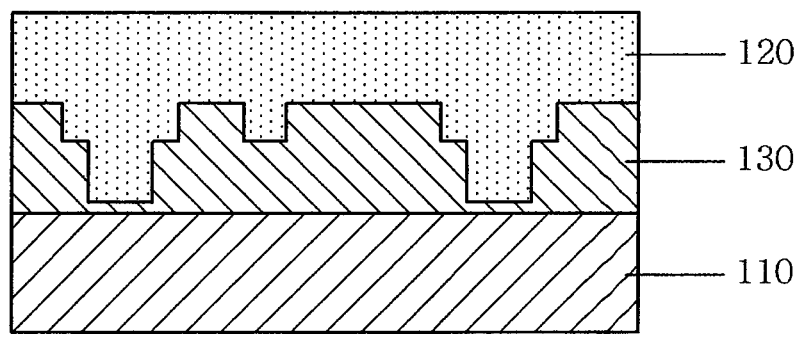
FIGS. 3A to 3F are schematic sectional views illustrating the respective steps of the flowchart of FIG. 2.

First, at step S110, the insulating resin layer 130 is formed on the chassis 110 to have a thickness of about 10 μm, as shown in FIG. 3A. The insulating resin layer 130 is made of a high polymer material having appearance characteristics similar to a thin rubber plate, that is, a material similar or identical to a conventional heating pad. For this purpose, solid film-type insulating resin, having adhesiveness, or liquid insulating resin may be applied to the top surface of the insulating resin layer 130.

In this case, the solid film-type insulating resin is applied to the chassis 110 using a lamination method, and the liquid insulating resin is applied to the chassis 110 using a molding method employing spin coating or blade coating. Furthermore, when the liquid insulating resin layer 130 is formed, the process proceeds to the next step after the liquid insulating resin layer 130 is placed in semi-cured status due to the evaporation of the solvent thereof.

Figure 3B:
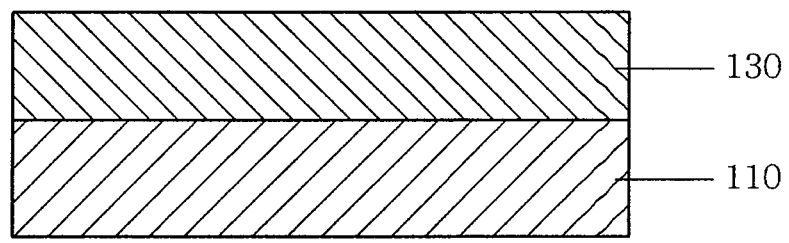
Figure 3C:
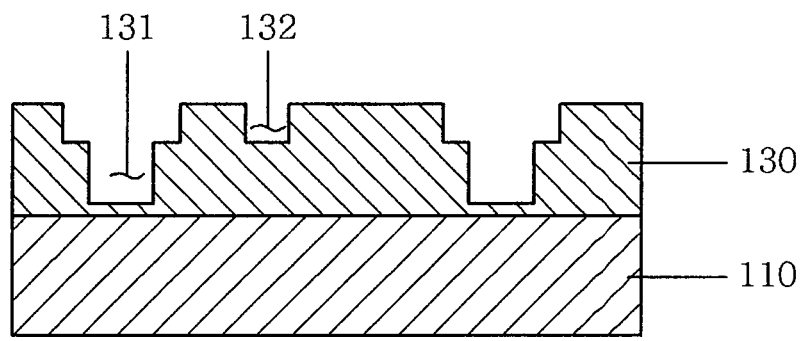

Thereafter, at step S120, engraved circuit patterns 131 and 132 are formed by engraving circuit patterns on the insulating resin layer 130 (which is placed in semi-cured status) using a stamp 120, as shown in FIGS. 3B and 3C. Embossed circuit patterns are formed on the lower surface of the stamp 120. The engraved circuit patterns are 131 and 132 are formed by pressing the stamp 120 onto the insulating resin layer 130 using a predetermined force.

Figure 3D:
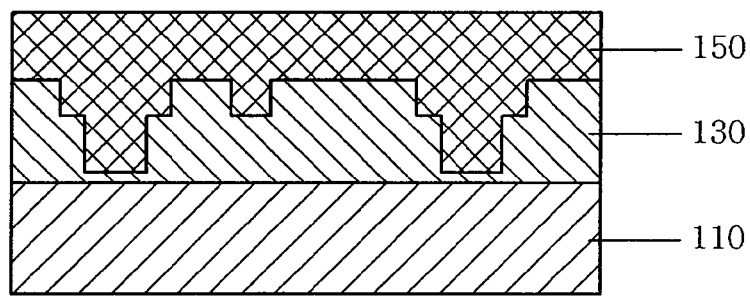

Thereafter, at step S130, the insulating resin layer 130, in which the engraved circuit patterns 131 and 132 are formed, is filled with metal material, such as copper, or is plated with the metal material, as shown in FIG. 3D.

Figure 3E:
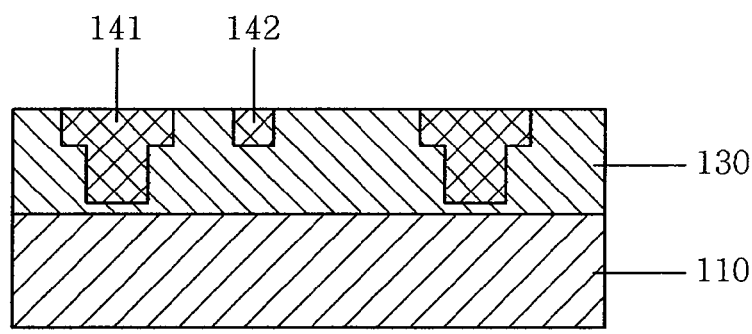

Thereafter, at step S140, circuit patterns 141 and 142 are formed by removing metal material, such as copper, that does not fill the engraved patterns 131 and 132 or has not been used to plate the engraved patterns 131 and 132, as shown in FIG. 3E. In this case, a process of flattening a coating layer or a plating layer to remove the metal material may be performed using a physical or chemical method.

Figure 3F:
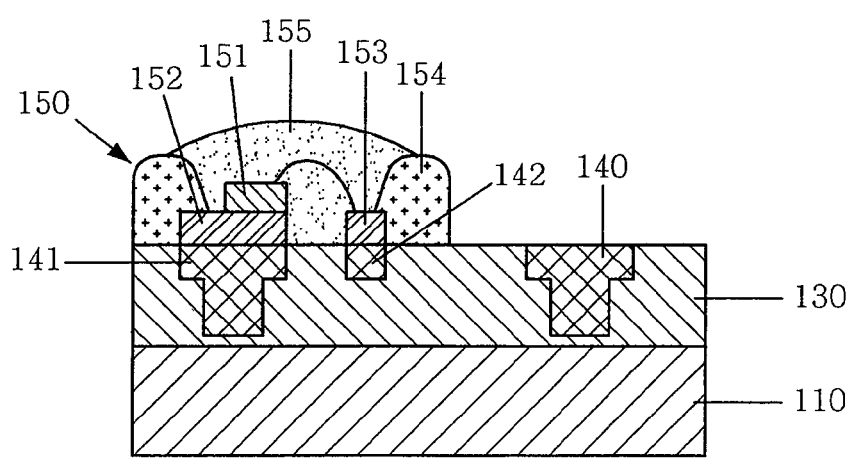
Figure 4:
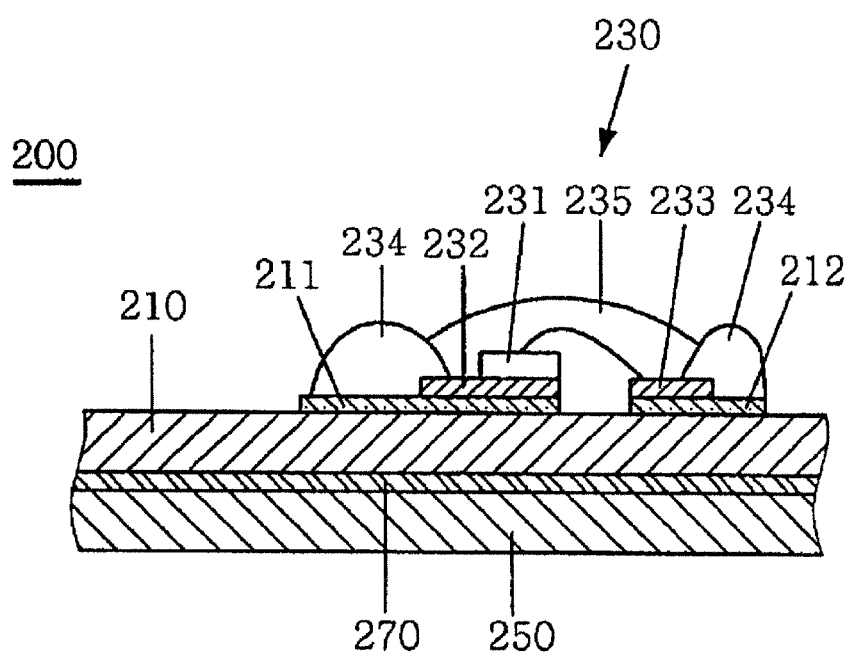
FIG. 4 is a schematic sectional view of a conventional LED backlight unit.

Finally, at step S150, the light source modules, that is, the LED package 150, are mounted on the chassis 110 and are electrically connected with the circuit patterns 141 and 142, as shown in FIG. 3F. In greater detail, the light source modules are mounted on the insulating resin layer 130 disposed on the chassis 110.

Unlike the conventional backlight unit, the backlight unit 100 of the present embodiment does not require any separate PCB or heating pad, thus greatly reducing the thickness thereof. That is, the conventional PCB, having a thickness of about 0.8 mm, and the conventional heating pad, having a thickness of about 0.2 mm can be replaced with the insulating resin 130 having a thickness of 10 µm, therefore a reduction to about 1/100 of an original thickness can be achieved.

Although, in the present embodiment, the backlight unit 100 is formed using the insulating resin 130 having a thickness of 10 µm, the thickness may be varied within the range of 1 µm~200 µm in various ways according to the design of the circuit patterns. The thermal resistance values of the backlight unit 100 depending on variation in the thickness of the insulating resin layer 130, as determined through experimentation, are listed in the following Table 1.

TABLE 1

| Thickness of insulating resin (µm) | Thermal resistance (° C./W) |
|---|---|
| 1 | 0.08 |
| 2 | 0.16 |
| 3 | 0.24 |
| 4 | 0.32 |
| 5 | 0.40 |
| 6 | 0.48 |
| 7 | 0.56 |
| 8 | 0.63 |
| 9 | 0.71 |
| 10 | 0.79 |
| 20 | 1.59 |
| 30 | 2.38 |
| 40 | 3.17 |
| 50 | 3.97 |
| 60 | 4.76 |
| 70 | 5.56 |
| 80 | 6.35 |
| 90 | 7.14 |
| 100 | 7.94 |
| 200 | 15.87 |

From Table 1, it can be seen that the thickness of the insulating resin layer 130 that can be applied to the present invention does not exceed 0.2 mm (200 µm), which is the thickness of a conventional heating pad. As a result, a reduction in the thickness of the conventional PCB having a thickness of 0.8 mm can be achieved even though the insulating resin layer is formed to have the maximum thickness. That is, the total thickness can be reduced to at least 1/5.

Furthermore, when the thickness of the insulating resin layer is 10 µm as in the present embodiment, the thermal resistance thereof is 0.79° C./W, therefore the thermal resistance of the present embodiment can be greatly reduced, to about 1/87.8 of the original thermal resistance of 69.4° C./W, which is achieved by using a PCB having a thickness of 0.8 mm and a heating pad having a thickness of 0.2 mm. Furthermore, even when the thickness of the insulating resin layer is 100 µm, the thermal resistance can be reduced to about 1/8.7 of the original thickness. Furthermore, even when the thickness of the insulation resin layer is 200 µm, the thermal resistance can be reduced to about 1/4.4 of the original thickness.

In accordance to the LED backlight unit and the method of manufacturing the LED backlight unit according to the present invention, circuit patterns are formed in the insulating resin layer formed on the chassis, so that no PCB and heating pad are required, therefore the total thickness can be greatly reduced and, at the same time, the total thermal resistance can be reduced.

Furthermore, no heating pad is required to connect a PCB to the chassis, so that the manufacturing process of the backlight can be simplified and, at the same time, the manufacturing cost thereof can be reduced.

Furthermore, a plurality of interfaces generated when the PCB and the heating pad are used can be removed, therefore the thermal resistance attributable to the interfaces can be additionally reduced.

Furthermore, the thermal resistance is greatly reduced, so that heat generated by the LED chips can be smoothly removed, therefore an increase in the temperature of LED chips is prevented and, thus, a reduction in the amount of light and variation in wavelength of the LED chips is removed. As a result, reliability can be increased and the lifespan of the LED chips can be increased.

Although the preferred embodiment of the present invention has been disclosed for illustrative purposes, those skilled in the art will appreciate that various modifications, additions and substitutions are possible, without departing from the scope and spirit of the invention as disclosed in the accompanying claims.

What is claimed is:

1. A method of manufacturing an LED backlight unit, comprising the steps of:
    forming an insulating resin layer on a chassis, wherein the insulating resin layer having a first surface and an opposing second surface;
    pressing the insulating resin layer with a patterned stamp from the first surface towards the opposing second surface to form embossed circuit patterns in the insulating resin layer;
    filling or plating the embossed circuit patterns formed in the insulating layer with a metal material;
    planarizing each of the filled or plated circuit patterns to define a top surface and expose the first surface of the insulating resin layer; and
    mounting one or more light source modules on the insulating resin layer and electrically connecting the one or more light source modules with the top surfaces of the filled or plated embossed circuit patterns, wherein a bottom surface opposite to the top surface of each of the filled or plated embossed circuit patterns is spaced apart from the second surface of the insulating resin layer.

2. The method as set forth in claim 1, wherein, at the step of forming the insulating resin layer on the chassis, the insulating resin layer has a thickness of 200 µm or less.

3. The method as set forth in claim 1, wherein the step of forming the insulating resin layer on the chassis is performed by laminating insulating resin on the chassis in solid film form or applying insulating resin to the chassis in liquid form.

4. The method as set forth in claim 3, wherein the insulating resin is applied to the chassis in liquid form using a molding method employing spin coating or blade coating.

5. The method as set forth in claim 1, wherein the light source modules are LED packages.

* * * * *